United States Patent
Wajcer et al.

(10) Patent No.: US 7,245,129 B2
(45) Date of Patent: Jul. 17, 2007

(54) APPARATUS FOR AND METHOD OF CABLE DIAGNOSTICS UTILIZING TIME DOMAIN REFLECTOMETRY

(75) Inventors: Daniel Wajcer, Beit-Yehoshua (IL); Naftali Sommer, Rishon Letzion (IL); Nohik Semel, Kfar Saba (IL)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/353,578

(22) Filed: Feb. 13, 2006

(65) Prior Publication Data
US 2006/0181283 A1    Aug. 17, 2006

Related U.S. Application Data

(60) Provisional application No. 60/653,179, filed on Feb. 14, 2005.

(51) Int. Cl.
*G01R 31/11*    (2006.01)
(52) U.S. Cl. .................. 324/533; 324/534; 324/603; 324/527
(58) Field of Classification Search ............... 324/533, 324/534, 602, 603
See application file for complete search history.

(56) References Cited

U.S. PATENT DOCUMENTS

| | | | |
|---|---|---|---|
| 5,461,318 A * | 10/1995 | Borchert et al. | 324/533 |
| 6,501,607 B2 * | 12/2002 | Keirn et al. | 360/31 |
| 6,559,657 B1 * | 5/2003 | McCarthy et al. | 324/642 |
| 6,825,672 B1 * | 11/2004 | Lo et al. | 324/533 |
| 6,959,037 B2 * | 10/2005 | Bailey et al. | 375/224 |
| 2002/0067802 A1 * | 6/2002 | Smith et al. | 379/1.04 |
| 2004/0013178 A1 | 1/2004 | Bui et al. | 375/219 |
| 2004/0013208 A1 | 1/2004 | Bui et al. | 375/316 |
| 2004/0032921 A1 | 2/2004 | Bui | 375/350 |
| 2004/0251912 A1 * | 12/2004 | Pharn et al. | 324/534 |
| 2004/0251913 A1 * | 12/2004 | Pharn et al. | 324/534 |

* cited by examiner

*Primary Examiner*—Anjan Deb
*Assistant Examiner*—John Zhu
(74) *Attorney, Agent, or Firm*—Steven A. Shaw; W. James Brady; Frederick J. Telecky, Jr.

(57) ABSTRACT

A novel mechanism for performing high accuracy cable diagnostics. The mechanism utilizes time domain reflectometry (TDR) to detect and identify cable faults, perform estimations of cable length, identify cable topology, identify load and irregular impedance on metallic paired cable, such as twisted pair and coaxial cables. The TDR mechanism transmits pulses whose shapes are programmable and analyzes the signal reflections. The shapes of the pulses transmitted can be optimized in accordance with the channel characteristics. Further, the TDR mechanism is adapted to operative in the presence of high pass filters in the channel.

18 Claims, 9 Drawing Sheets

APPARATUS FOR AND METHOD OF CABLE DIAGNOSTICS UTILIZING TIME DOMAIN REFLECTOMETRY

REFERENCE TO PRIORITY APPLICATION

This application claims priority to U.S. Provisional Application Ser. No. 60/653,179, filed Feb. 14, 2005, entitled "Time Domain Reflectometry Methods for Cable Diagnostics," incorporated herein by reference in its entirety.

FIELD OF THE INVENTION

The present invention relates to the field of data communications and more particularly relates to an apparatus for and method of performing high accuracy cable diagnostics, including, for example, detection of cable faults, cable length, utilizing time domain reflectometry.

BACKGROUND OF THE INVENTION

Modern network communication systems are generally of either the wired or wireless type. Wireless networks enable communications between two or more nodes using any number of different techniques. Wireless networks rely on different technologies to transport information from one place to another. Several examples include, for example, networks based on radio frequency (RF), infrared, optical, etc. Wired networks may be constructed using any of several existing technologies, including metallic twisted pair, coaxial, optical fiber, etc.

Communications in a wired network typically occurs between two communication transceivers over a length of cable making up the communications channel. Each communications transceiver comprises a transmitter and receiver components. A fault along the communication channel causes a disruption in communications between the transceivers. Typically, it is desirable to be able to determine when a fault occurs in the channel. Once a fault is detected, it is desirable to determine information about the fault, such as its location along the channel.

Even in the absence of a fault is often desirable to be able to obtain information about the communications channel, i.e. to perform cable diagnostics on the channel. Examples of the type of information it would be useful to have include (1) identifying cable faults such as an open cable, shorted cable, unmatched load, irregularities of the impedance along the cable, (2) determining the length of the cable, etc.

There are many instances where it is desirable to be to determine the length of the cable so as to identify faults or discontinuities along its length. In accordance with a management scheme, baseline measurements are taken initially and then checked periodically over time. Any deviations from the baseline that are detected may be logged and reported to higher layers.

In another application, customers can be charged for cable and installation by the total length purchased or installed. A cable diagnostics mechanism is useful in this situation to measure length of cable after installation without the requirement to measure it beforehand.

Further, as the cost of Gigabit Ethernet (GE) equipment decreases, it is likely to be installed in more and more networks. Older legacy networks that use Cat 3 or 4 wiring are being upgraded with Gigabit Ethernet adapters, switches, routers, etc. Many of these networks will not upgrade the cable and will retain their old cable plant thus creating potential transmission problems due to the use of cable designed for slower networks. Cable diagnostic tools can potentially help identify problems.

The ability to gather diagnostics on the cable is particularly useful in the case where physical access to the cable is extremely difficult or impossible. Further, it is desirable to have the cable diagnostics capabilities built into the communications transceiver without requiring significant modification to existing transceivers.

Thus, there is a need for a mechanism for a cable diagnostic system that is capable of determining information, including cable length, cable faults (including their locations), about a communications channel comprising a metallic cable that can be incorporated into a conventional communications transceiver without requiring extensive modifications to the transceiver.

SUMMARY OF THE INVENTION

The present invention is a novel mechanism for performing high accuracy cable diagnostics. The mechanism can be incorporated into a conventional Ethernet transceiver, such as a Gigabit Ethernet transceiver, with minimal modification thus eliminating the need to use special and costly cable measurement equipment. The cable diagnostic mechanism enables the detection and identification of cables faults, estimation of cable length, identification of cable topology and identification of load and irregular impedance on metallic paired cable, such as twisted pair and coaxial cables.

The cable diagnostics mechanism of the present invention uses a time domain reflectometry (TDR) mechanism whereby pulses are transmitted and any resulting signal reflections are detected and analyzed to generate diagnostic information about the channel. The shape of the pulses transmitted by the TDR mechanism is programmable and can be optimized in accordance with the particular channel characteristics such as cable length and type, including the transmitter and receiver paths. Optimizing the transmitted pulse shape results in optimal analysis for faults located anywhere along the cable.

Using time domain reflectometry, the present invention is capable of detecting and identifying cable faults, such as open cables, shorted cables, unmatched loads or any irregularities in the impedance along the cable. Such irregularities may be caused by defective, broken or loose connectors, damaged cables or a variety of other faults.

Further, the time domain reflectometry based cable diagnostic mechanism of the present invention is adapted to operate in the case where the channel comprises high pass filters. The use of high pass filters in the channel causes the amplitude of the reflected signals to be somewhat reduced. The present invention includes techniques to overcome this problem.

Although the mechanism of the present invention can be used in numerous types of communication networks, it is intended that a common usage of the diagnostic mechanism is with metallic paired cable such as typically used in Ethernet networks.

The TDR mechanism of the present invention provides several advantages including: (1) the reuse of hardware already available on conventional transceivers for transmission of the TDR pulse; (2) use of a programmable pulse shape that can best be fitted to enhance performance given a particular channel model, where the channel model includes any filtering performed by the transmitter or receiver; (3) use of a programmable detection unit optimized to enhance detection given a channel model and transmitted pulse shape; (4) support of cable diagnostics on high pass filter channels; (5) use of an averaging mechanism that enables reliable detection in noisy environments; and (6) making a series of TDR observations using different types of transmitted pulses on each measurement such that the total observation covers the entire cable length, where longer pulses are better for identifying far located faults, while short pulses are better for locating close cable faults (since the blind-spot region caused by the transmitted pulse width is minimized).

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application-Specific Integrated Circuit (ASIC) or Field Programmable Gate Array (FPGA), or as functionally equivalent discrete hardware components.

There is therefore provided in accordance with the invention, a method of performing diagnostics on a metallic paired cable for use in a communications transceiver, the method comprising the steps of generating and transmitting a pulse from one end of the cable, receiving a reflected signal and generating a sequence of samples therefrom, detecting and measuring the amplitude of positive and negative peaks present in the reflected signal and determining diagnostic information about the cable based on the location and amplitude of the positive and negative peaks.

There is also provided in accordance with the invention, an apparatus for performing cable diagnostics on a metallic paired cable for used in a communications transceiver comprising a pulse generator coupled to the channel, the pulse generator operative to transmit a pulse onto the cable, a peak detector coupled to the cable and operative to detect and measure the amplitude of positive and negative peaks present in a reflected signal, a memory coupled to the peak detector for storing peak location and amplitude information and means for determining diagnostic information about the cable based on the location and amplitude of the positive and negative peaks.

There is further provided in accordance with the invention, an apparatus for performing cable diagnostics on a metallic paired cable for used in a communications transceiver comprising means for generating and transmitting a pulse from one end of the cable, means for receiving a reflected signal and generating a sequence of samples therefrom, means for detecting and measuring the amplitude of positive and negative peaks present in the reflected signal and means for determining diagnostic information about the cable based on the location and amplitude of the positive and negative peaks.

There is also provided in accordance with the invention, a communications transceiver comprising a transmitter, a receiver, a diagnostic module for performing cable diagnostics on a metallic paired cable coupled to the transceiver, the diagnostic module comprising, a pulse generator coupled to the channel, the pulse generator operative to transmit a pulse onto the cable, a peak detector coupled to the cable and operative to detect and measure the amplitude of positive and negative peaks present in a reflected signal, a memory coupled to the peak detector for storing peak location and amplitude information and means for determining diagnostic information about the cable based on the location and amplitude of the positive and negative peaks.

There is further provided in accordance with the invention, a method of performing diagnostics on a metallic paired cable for use in a communications transceiver having an active link partner, the method comprising the steps of generating echo canceller coefficients, detecting and measuring the amplitude of positive and negative peaks present in the echo canceller coefficients and determining diagnostic information about the cable based on the location and amplitude of the positive and negative peaks.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
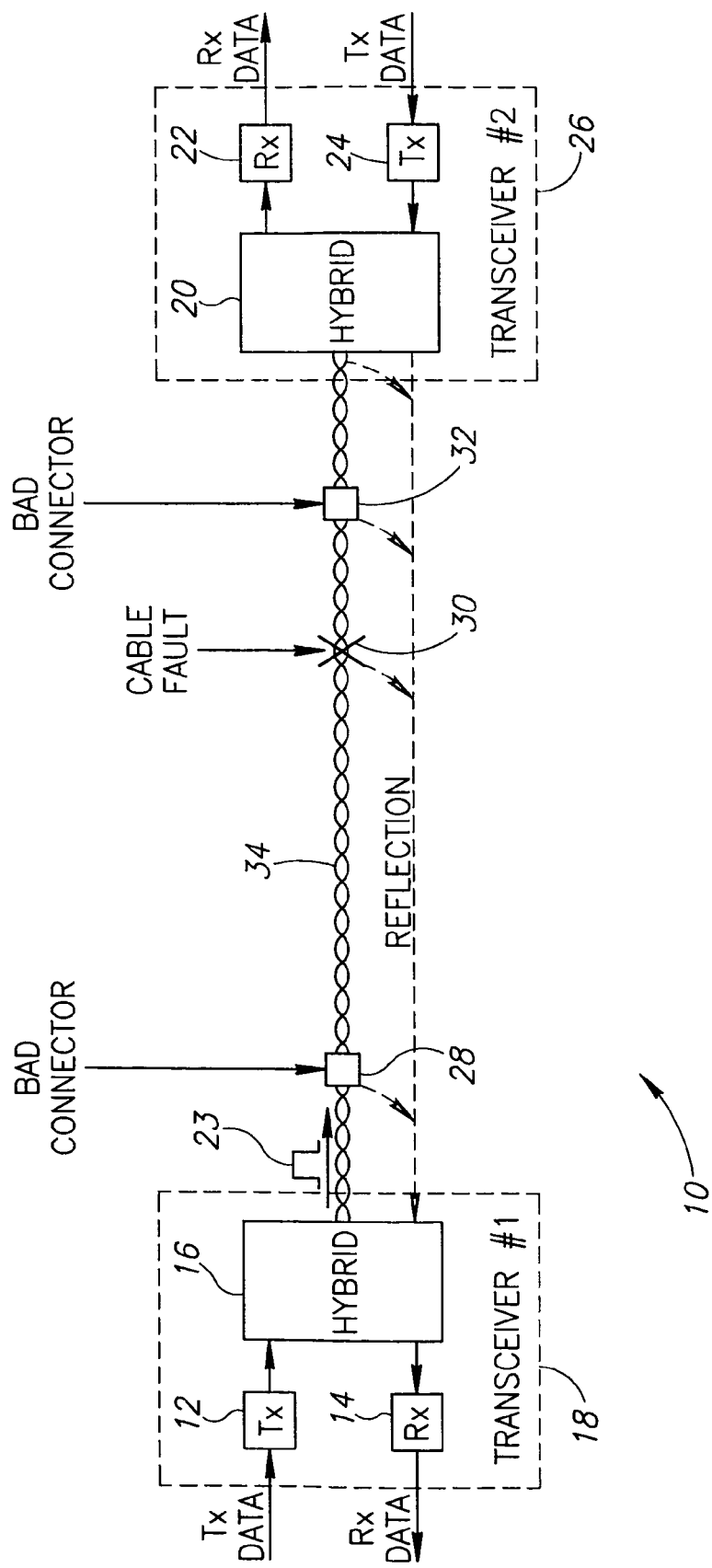
FIG. 1 is a block diagram illustrating the generalized time domain reflectometry scheme of the present invention.

The following notation is used throughout this document.

| Term | Definition |
| --- | --- |
| A/D | Analog to Digital Converter |
| AGC | Automatic Gain Control |
| ASIC | Application Specific Integrated Circuit |
| DC | Direct Current |
| DFE | Decision Feedback Equalizer |
| DSP | Digital Signal Processor |
| FFE | Feed Forward Equalizer |
| FPGA | Field Programmable Gate Array |
| GE | Gigabit Ethernet |
| HDL | Hardware Description Language |
| HPF | High Pass Filter |
| IC | Integrated Circuit |
| LUT | Lookup Table |
| PGA | Programmable Gain Amplifier |
| RF | Radio Frequency |
| STP | Shielded Twisted Pair |

-continued

| Term | Definition |
| --- | --- |
| TDR | Time Domain Reflectometry |
| UTP | Unshielded Twisted Pair |

DETAILED DESCRIPTION OF THE INVENTION

The present invention provides a novel mechanism for performing high accuracy cable diagnostics. The mechanism utilizes time domain reflectometry (TDR) to detect and identify cable faults, perform estimations of cable length, identify cable topology, identify load and irregular impedance on metallic paired cable, such as twisted pair and coaxial cables. The TDR mechanism transmits pulses whose shapes are programmable and analyzes the signal reflections. The shapes of the pulses transmitted can be optimized in accordance with the channel characteristics. Further, the TDR mechanism is adapted to operate in the presence of high pass filters in the channel.

To aid in understanding the principles of the present invention, the description of the cable diagnostic mechanism is provided in the context of an Ethernet transceiver circuit that can be realized in an integrated circuit (IC). The cable diagnostic mechanism of the present invention has been incorporated an Ethernet IC adapted to provide 10Base-T, 100Base-Tx and 1000Base-T communications over a metallic twisted pair channel.

It is appreciated by one skilled in the art that the TDR mechanism of the present invention can be adapted for use with numerous other types of wired communications networks such as coaxial channels, etc.

Note that throughout this document, the term communications device is defined as any apparatus or mechanism adapted to transmit, receive or transmit and receive data through a medium. The term communications transceiver is defined as any apparatus or mechanism adapted to transmit and receive data through a medium. The communications device or communications transceiver may be adapted to communicate over any suitable medium, including wired media such as twisted pair cable or coaxial cable. The term Ethernet network is defined as a network compatible with any of the IEEE 802.3 Ethernet standards, including but not limited to 10Base-T, 100Base-Tx or 1000Base-T over shielded or unshielded twisted pair wiring. The terms communications channel and cable are used interchangeably. The term symbol is that used by someone of ordinary skill in the art with knowledge of the IEEE 802.3 Ethernet standards. For example, One baud=one transmitted symbol per second, where the transmitted symbol may contain the equivalent value of 1 or more binary bits.

A block diagram illustrating the generalized time domain reflectometry scheme of the present invention is shown in FIG. 1. The example communications systems, generally referenced 10, comprises a transmitter/receiver (transceiver) #1 18 and transceiver #2 26 that communicates with each other over communication channel 34. The channel may comprise any wired link, e.g., metallic pair cable such as Cat 3, 4, 5, 6 or 7 shielded (STP) or unshielded twisted pair (UTP) cable. Transceiver #1 comprises a transmitter 12, receiver 14 and hybrid 16 coupled to the communications channel. Transceiver #2 comprises a transmitter 24, receiver 22 and hybrid 20 coupled to the communications channel.

In operation, each transceiver receives an input data stream (TX_DATA) from an external data source such as a host or other entity (not shown). The transceiver generates an output symbol stream from the input data stream and transmits the output symbol stream over the communications channel to the transceiver on the other side. The transceivers on either end of a channel (i.e. transceivers #1 and #2) are considered link partners. A link partner can be either active or inactive. An inactive link partner is a transceiver that is not transmitting at the moment. An active link partner is a transceiver that is currently transmitting.

In the receive direction, each transceiver receives a receive signal from the communications channel. The receive signal may comprise an input symbol stream transmitted from the link partner. The transceiver generates and output RX_DATA from this input symbol stream. The receive signal may also comprise a signal representing energy from the original transmitted signal that has been reflected back towards the transceiver. The transmitted signal may be reflected back due to a channel fault such as an open cable, shorted cable, unmatched load or any irregularities in impedance along the length of the cable. Such irregularities may be caused by broken, bad or loose connectors, damaged cables or other faults.

In the example of FIG. 1, the pulse 23 transmitted by transceiver #1 is reflected back toward transceiver #1 due to the presence of bad connectors 28, 32 along the cable. In addition, a cable fault indicated by the 'X' 30 also causes energy from the transmitted pulse to be reflected back towards transceiver #1.

Figure 2:
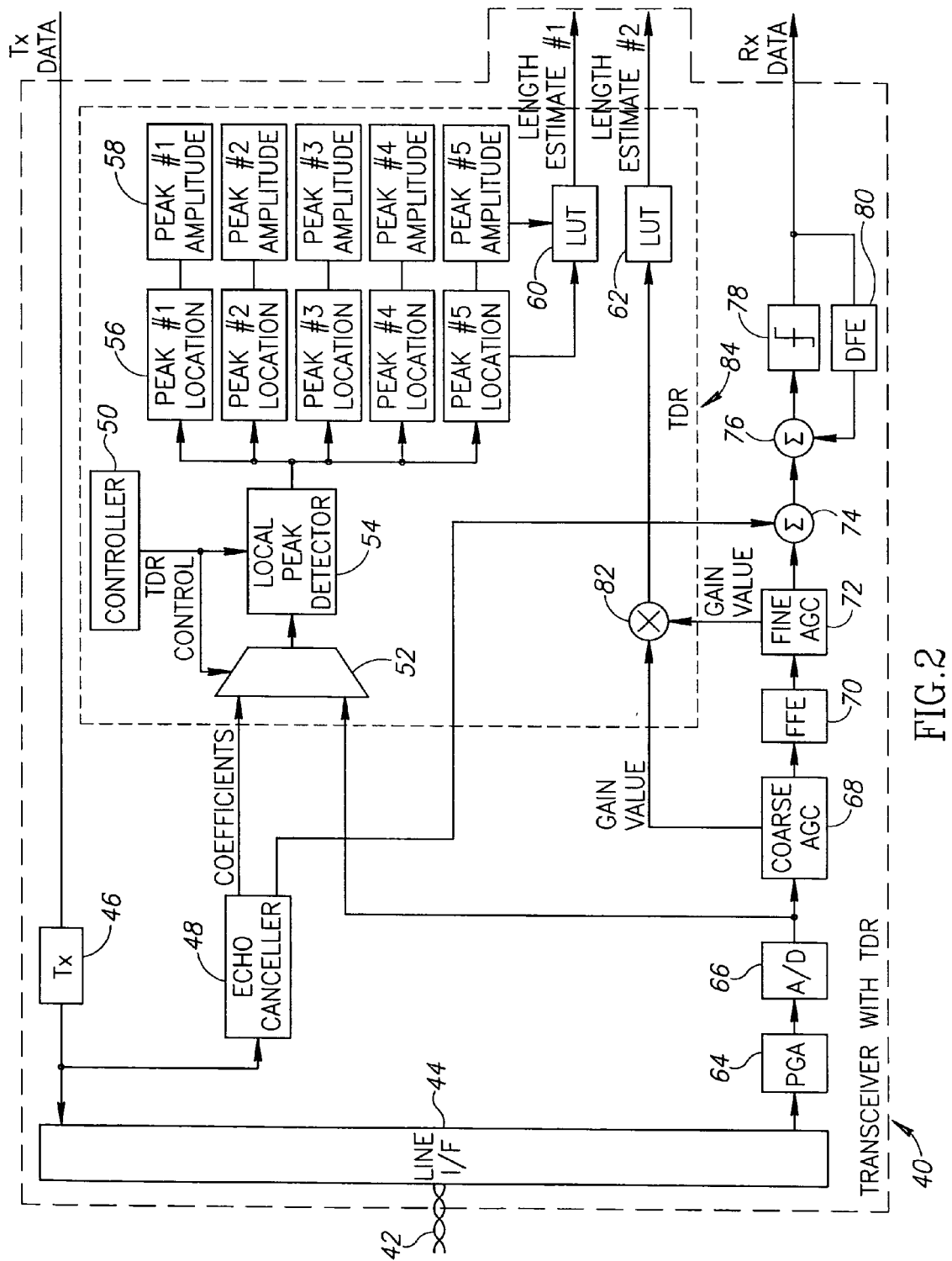
FIG. 2 is a block diagram illustrating in more detailed an example transceiver incorporating the time domain reflectometry scheme of the present invention.

A block diagram illustrating in more detailed an example transceiver incorporating the time domain reflectometry scheme of the present invention is shown in FIG. 2. The transceiver, generally referenced 40, comprises a line interface coupled to the metallic paired cable 42, transmitter module 46, echo canceller 48, programmable gain amplifier (PGA) 64, analog to digital converter (A/D) 66, course automatic gain control (AGC) 68, feed forward equalizer (FFE) 70, summers 74, 76, slicer 78, decision feedback equalizer (DFE) 80 and time domain reflectometry (TDR) module 84. The TDR module comprises a multiplexer 52, controller 50, multiplier 82, local peak detector 54, memory 56, 58 for holding locations of peaks and corresponding amplitudes look up tables (LUTs) 60, 62. Note that the transceiver presented herein is provided as an illustrative embodiment. It is appreciated that other configurations of transceiver can be used as well without departing from the scope of the invention. For example, the invention is operative with single AGC receivers and is not limited for use with coarse and fine AGC receivers.

The invention uses time domain reflectometry to detect impedance mismatches along the cable. Time domain reflectometry is an efficient tool for identifying cable faults, such as open cable, shorted cable, unmatched loads or any impedance mismatches existing along the cable. Such impedance mismatches may be caused by bad or loose connectors, damaged cables or a variety of other faults.

Using time domain reflectometry, the transceiver generates and transmits a pulse out onto the cable. When the pulse reaches a fault along the cable or end of the cable (i.e. open cable, shorted cable or a mismatched load), a portion of the transmitted pulse energy is reflected back. Using knowledge of the propagation speed along the cable the invention estimates the location of the fault. Further, by examining the amplitude and the polarity of the reflected signal, the invention is also able to estimate the impedance of the fault. It is noted that traditionally, such estimates were performed using dedicated costly equipment operated by a well-trained technician. An advantage of the invention is that the TDR mechanism can easily be incorporated into a communications transceiver such as Gigabit Ethernet transceiver or any other equivalent device in other types of communication systems.

The TDR mechanism of the present invention is operative to detect impedance mismatches that exist along a metallic paired cable. An impedance mismatch on the cable results in a peak in the reflected signal. The TDR module 84 processes the received signal searching for peaks and their corresponding amplitudes. A description of the transceiver incorporating the TDR module will now be presented.

In operation, the transceiver generates and transmits pulses using the transmitter module 46. The pulses are sent over the cable through the line interface 44. The pulses used may have any suitable shape such as square, sine wave, etc. Preferably, the pulse shape is chosen to match the expected response of the channel (i.e. the cable). Matching the pulse shape to the channel maximizes the amplitude of the reflected signal. The invention provides for a programmable pulse shape that can be configured in accordance with dynamic channel impulse response measurements. In the example presented herein, rectangular square pulses are used.

In addition to pulse shape, the width of the pulse is also varied in accordance with the length of the channel. As described in more detail infra, wider pulses are used to better detect mismatches on longer cable lengths (e.g. >20 meters). Shorter pulses are better suited to detect mismatches on shorter cable lengths (e.g. <20 meters).

The reflected signal is received on the channel 42 and received at the line interface 44. The signal is processed by the regular receive path of the transceiver as follows. The signal is input to the PGA 64 and converted from the analog to the digital domain by A/D 66. The amplitude of the signal is adjusted by the coarse and fine AGC circuits 68, 72 and passes through equalizer 70. The echo is then canceled from the receive signal via summer 74 using the echo cancellation signal generated by echo canceller 48. A DFE 80 and slicer 78 generate the receive data RX DATA.

The output of the A/D converter is the input to the TDR module 84. A multiplexer 52 selects either the received signal from cable or the coefficients from the echo canceller. The invention thus provides the ability to operate the TDR mechanism either on the received reflected signal samples from the channel or on the echo canceller coefficients. The latter is useful in the case of an active link partner and permits detection of cable faults and cable length during normal operation of the transceiver.

The invention therefore provides two modes for activating the TDR mechanism. The first mode looks at the reflected samples from the channel. This mode is used when there is no active link partner, i.e. it is assumed the line is quiet, pulses are transmitted having a certain shape (such as rectangular) and the channel is monitored for pulses that are reflected back to the receive side of the transceiver. The second mode looks at the echo canceller coefficients instead of the returning pulse using a similar algorithm. In this mode it is assumed that there is an active link partner which is transmitting and the echo canceller filter coefficients are analyzed instead of the returning pulse.

Regardless of the source of the input to the TDR module, the local peak detector functions to search for and detect peaks in the input signal. For illustration purposes, the description of the TDR module is presented assuming the input comprises the reflected signal samples. Note, however, that the description applies equality to the case where the input comprises the echo canceller coefficients. The operation of the peak detector is presented in more detail infra.

The peaks found by the peak detector are stored in memory. Both the location and amplitude of each peak detected is saved. Each impedance mismatch along the cable has a corresponding peak. A look up table is used to determine the cable length. The LUT functions to output cable length as a function of amplitude of the reflected signal. The contents of the LUT are determined a priori using actual measurements or calculations based on theoretical models and considering open cables, shorted cables, etc. Different tables are used for different cable types, e.g., Category 3, 4, 5, 6, etc.

The invention is operative to generate and transmit both positive and negative pulses. This is done to overcome the problem presented by high pass filters commonly used in the receiver front end of Ethernet transceivers. The high pass filters are normally used to improve performance and would be difficult to bypass for cable diagnostic purposes. The effect of the high pass filter is to reduce the energy of the reflected signal. To compensate for this, the TDR mechanism of the present invention includes the following:

1. The pulses used for diagnostics have both positive and negative portions. Since the high pass filter does not pass DC, the total energy of the transmitted pulse must be zero.
2. Since the high pass filter causes relatively low peaks in the return signal, the detection algorithm does not look for a single peak but rather looks for both positive and negative portions of the peak.

Figure 3:
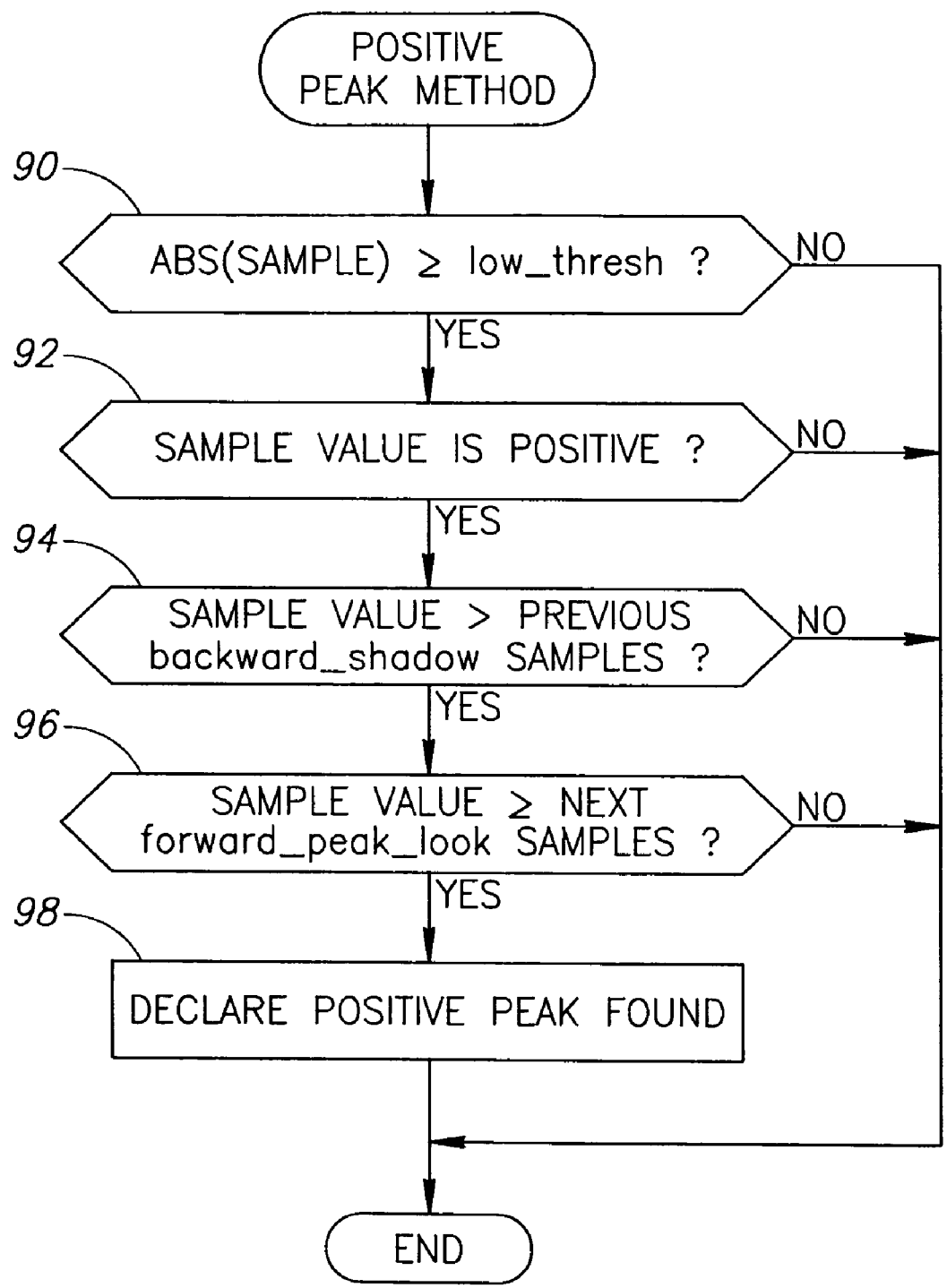
FIG. 3 is a flow diagram illustrating the method of the present invention of detecting positive peaks in a sequence of received samples.

The peak detection algorithm will now be described in more detail. First, the detection methods for positive and negative peaks are presented. This is followed by a description of the TDR algorithm itself. A flow diagram illustrating the method of the present invention of detecting positive peaks in a sequence of received samples is shown in FIG. 3. A positive peak is declared for a sample k only if all the following conditions are satisfied:

1. The absolute value of the sample is larger than or equal to a low threshold (step 90).
2. The sample value is positive (step 92).
3. The sample value is larger than the previous backward_shadow number of samples (step 94).
4. The sample value is larger than or equal to the next forward_peak_look number of samples (step 96).

If all the above four conditions are met, a positive peak is declared (step 98).

Figure 4:
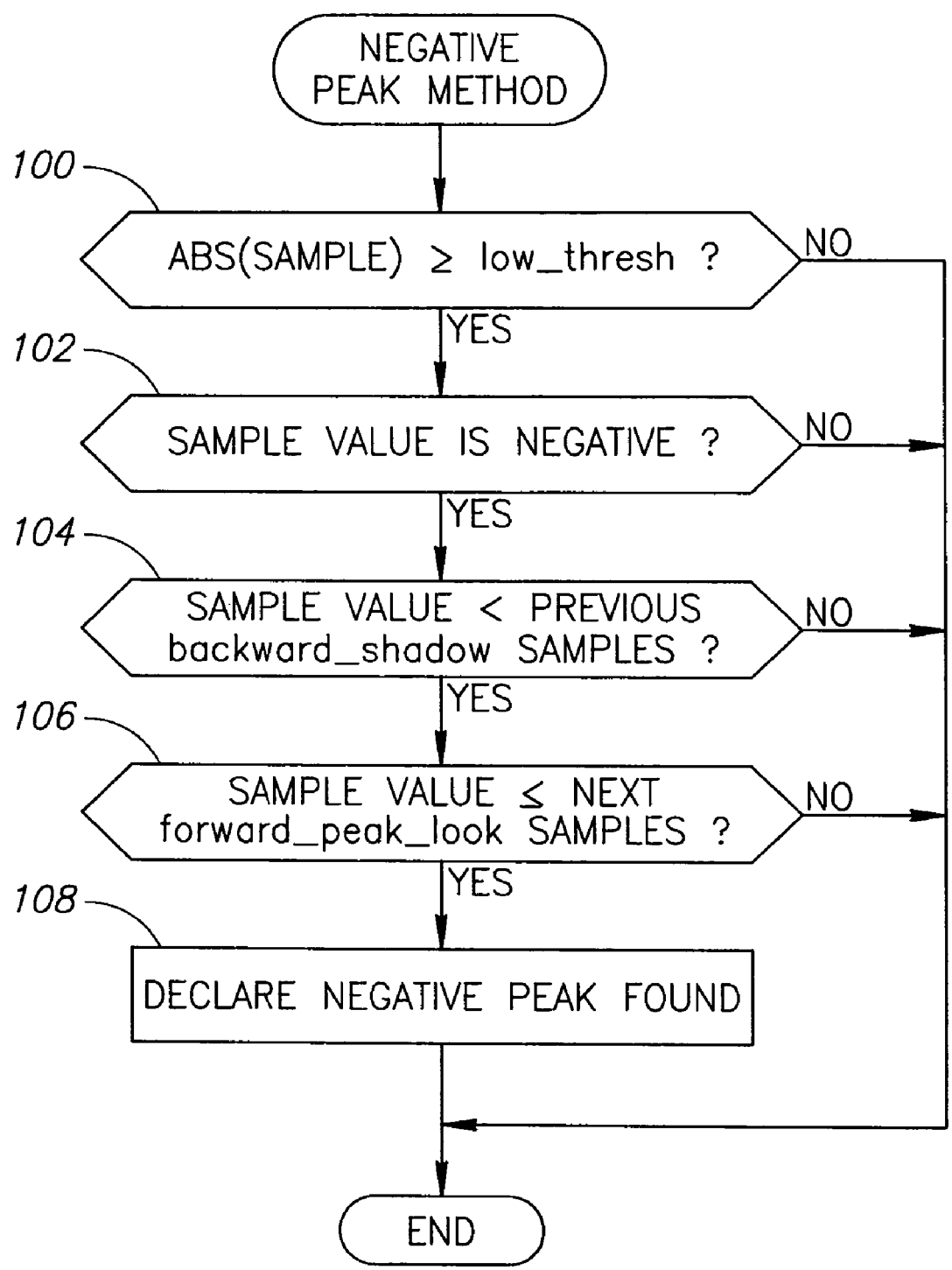
FIG. 4 is a flow diagram illustrating the method of the present invention of detecting negative peaks in a sequence of received samples.

A flow diagram illustrating the method of the present invention of detecting negative peaks in a sequence of received samples is shown in FIG. 4. A negative peak is declared for a sample k only if all the following conditions are satisfied:

1. The absolute value of the sample is larger than or equal to a low threshold (step 100).
2. The sample value is negative (step 102).
3. The sample value is smaller than the previous backward_shadow number of samples (step 104).
4. The sample value is smaller than or equal to the next forward_peak_look number of samples (step 106).

If all the above four conditions are met, a negative peak is declared (step 108).

Figure 5A:
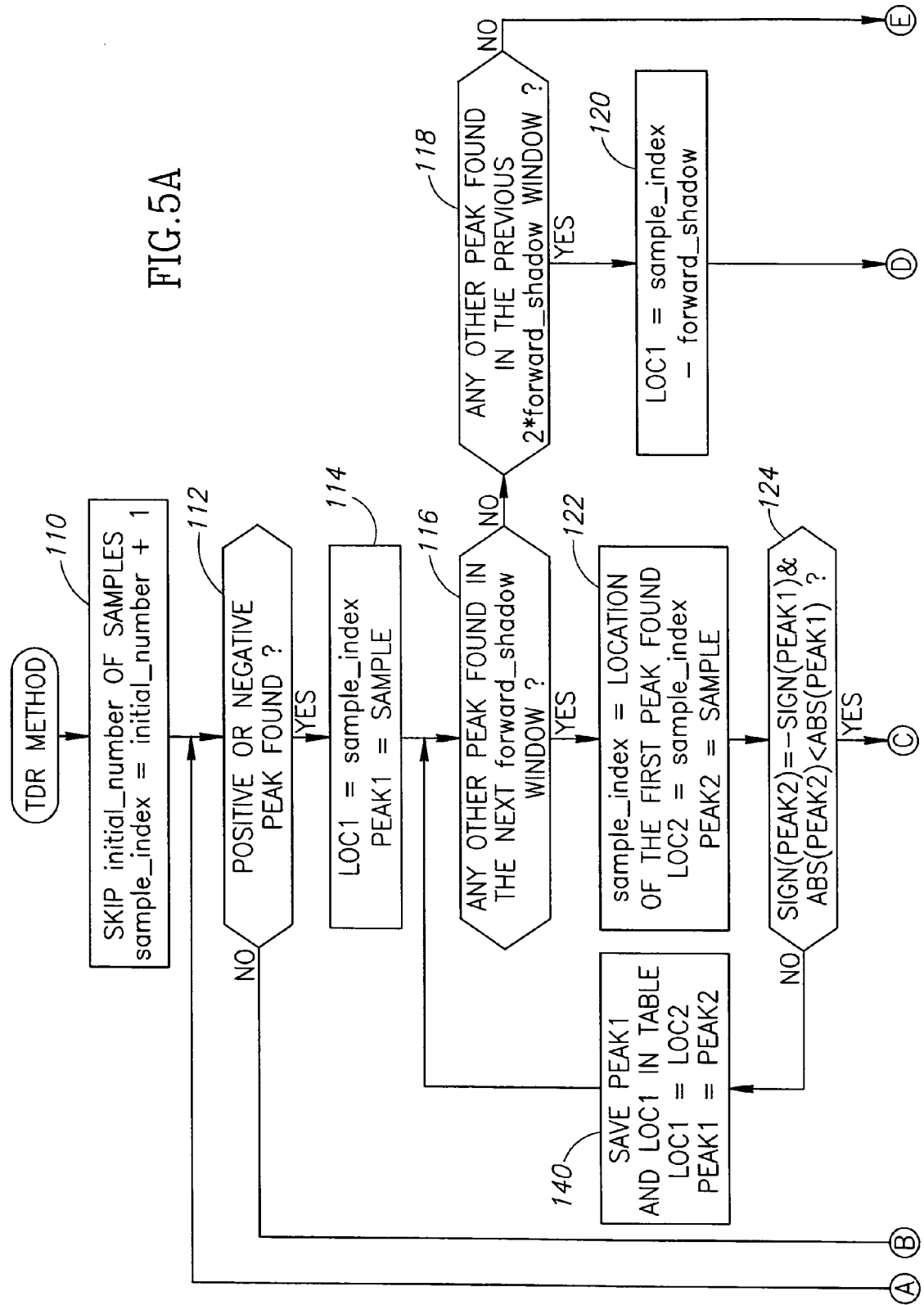
FIGS. 5A and 5B are a flow diagram illustrating the time domain reflectometry method of the present invention.
Figure 5B:
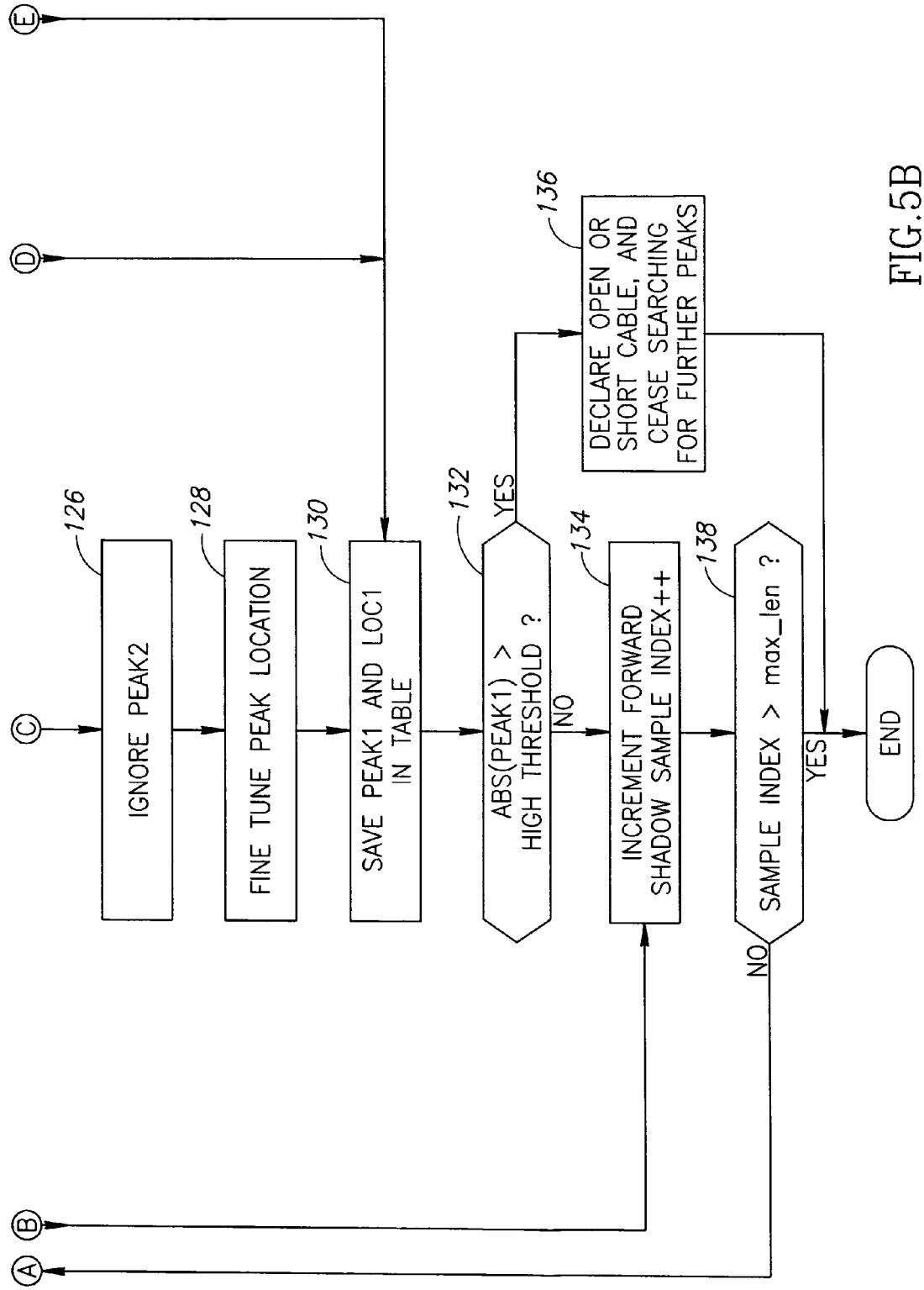

A flow diagram illustrating the time domain reflectometry method of the present invention is shown in FIGS. 5A and 5B. The method uses two thresholds: a low threshold (low_thresh) and a high threshold (high_thresh). The low and high thresholds are defined for each set of coefficients, in accordance with their locations.

A number (initial_skip) of the first initial samples are ignored and the sample index is set to the initial_number+1(step 110). The first few samples are ignored to account for the hybrid as reflections caused by the hybrid are not considered an impedance mismatch or irregularity. It is next checked whether a positive or negative peak was received (step 112). If a positive peak was found at sample k, the sample_index is stored in Loc1 and the sample itself is stored in Peak1 (step 114). It is then checked if any other peak was found in the next forward_shadow window (step 116). If not, it is checked whether any other peak was found in the previous 2*forward_shadow window (step 118). If not, the method continues with the 130. If a peak was found in the previous 2*forward_shadow window (step 118), Loc1 is replaced with the value sample_index—forward_shadow (step 120).

Note that the TDR method is operative to classify detected peaks as either matched peaks or unmatched peaks. A peak is denoted a 'matched peak' if a peak with an opposite sign and smaller absolute value of amplitude was found but ignored (in accordance with the methods of FIGS. 3 and 4). If no such ignored peak was found until forward_shadow samples have passed, the peak is denoted an 'unmatched peak'. If the last peak (i.e. the peak that corresponds to cable length) was an unmatched peak and the distance from this peak location to the previous peak location is less than 2*forward_shadow (step 118), then the last peak location is decreased by forward_shadow (step 120).

If a peak was found in the next forward_shadow window (step 116), the sample_index is set to the location of the first peak found and stored in Loc2 and the sample itself is stored in Peak2 (step 122). It is then checked if the sign of Peak2 is opposite that of Peak1 and if Peak2 is smaller absolute value than Peak1 (step 124). If not, peak1 and loc1 are saved in the table and Loc1 and Peak1 are set to Loc2 and Peak2, respectively (step 140) and the method continues with step 116.

Otherwise, if the sign of Peak2 is opposite that of Peak1 and if Peak2 is smaller absolute value than Peak1 (step 124) then peak2 is ignored (step 126). The peak location is then fine tuned (step 128). Each peak location is fine tuned as follows:

$$\text{peak\_location} = \text{peak\_location} * (1 - \text{fine\_tune\_factor}) \quad (1)$$

Fine tuning is performed since the pulse is 'smeared' as reflections arrive from longer distances along the cable causing the peak (or the 'center of gravity') of the pulse to move slightly forward. To compensate for this, the location is decreased slightly. The amount the location is decreased by can be approximated as a multiplication by a constant close to but smaller than one.

Peak1 and Loc1 are stored in the table (step 130). If the absolute value of the identified peak1 is greater than the high threshold high_thresh (step 132), then an open or shorted cable is declared and the method ceases searching for any further peaks (step 136). Otherwise, the forward_shadow and sample_index are incremented (step 134). If the sample_index is not greater than the max_len (step 138) the method returns to step 112, otherwise it terminates.

Note that the parameter forward_shadow is used to ignore the negative part of the peak when a positive peak is found. It is also used to ignore the positive part of the peak with a negative peak is found. The value assigned to forward_shadow is programmable and is set by the controller 50 (FIG. 2). In addition, the parameter forward_shadow is dynamically increased (step 134). The sample k, the value is expressed as follows:

$$\text{forward\_shadow} = \text{initial\_forward\_shadow} + k * \text{forward\_shadow\_increase} \quad (2)$$

Since the peaks on longer cables are more likely to smear into one another, dynamically increasing the forward_shadow parameter helps to improve accuracy of the TDR detection mechanism.

It is noted that the lower threshold (low_thresh) gear shift is used considering the fact that reflections for locations further away are more attenuated than reflections for locations that are closer. The high threshold (high_thresh) is used to detect the end of the cable. A threshold higher than the low threshold is used to prevent false detection of a connector beyond the end of the cable. This may be caused by a double reflection from a connector near the end of the cable.

Note also that the impulse response of a typical channel (with a high pass filter present) has fast rise times and slow fall times, which are slower with increasing cable lengths. A high pass filter (HPF) present on the channel causes the impulse response to have a negative undershoot during its fall time, since the HPF causes the sum of the impulse response taps to be zero. Therefore, when the TDR method searches for peaks of the absolute value (since the reflection coefficient may be negative), the negative undershoot may be mistakenly recognized as a peak. Therefore, the conditions for identifying positive and negative peaks (methods of FIGS. 3 and 4) imply that after a peak is found, some samples are ignored until the negative undershoot peak has passed.

In some instances, two adjacent peaks may be received. This may be caused by two physical connectors or a single connector located close to the edge of the cable. In the case two adjacent peaks are received, the second peak (which represents the cable length if there is a connector close to the edge of the cable), may be mistakenly ignored. The invention provides a correction mechanism for handling this case.

Note that the method of FIGS. 5A and 5B is operative to handle the case of adjacent peaks. First, only peaks with opposite sign are ignored. If adjacent peaks have the same sign, the second peak is not ignored since peaks with the same sign cannot correspond to negative undershoot.

Second, if the second peak is stronger (by some factor) than the first peak, the second peak is not ignored, since the negative undershoot is smaller than the corresponding positive peak. Therefore, the stronger peak is more likely to come from another reflection. In such a case, even if there is a connector close to the end of the cable, the reflection from it will likely be much weaker than the reflection from the open/shorted cable edge. Thus, this rule ensures that the correct peak is not ignored.

Third, for two peaks close to each other having approximately the same amplitude, the second peak may be ignored if it is unmatched. The negative undershoot of the second peak, however, will be detected as a peak. This peak will be unmatched, since no peak will be found to correspond to its negative undershoot (since it is already is a negative undershoot itself). Therefore, if the last peak (i.e. the peak corresponding to the cable length) is unmatched, it is likely its negative undershoot was found and the cable length should be corrected by going backward forward_shadow samples. The correction, however, should be performed only if there was a peak adjacent to the last peak. Otherwise, the unmatched peak may result from missing its negative undershoot due to it being too weak.

Depending on the particular implementation, the desired performance and available resources, the TDR mechanism of the present invention can be extended as follows. First, the TDR algorithm can be performed multiple times whereby the corresponding samples of all the iterations are accumulated (after alignment). This helps in situations where the transceivers operate in the presence of strong external noise. The number of iterations the sample results are averaged over is programmable and is preferably set in accordance with the conditions of the particular implementation.

Second, long pulses (e.g., five symbols long) are transmitted initially. If no peaks are found using long pulses, the TDR method is re-started using short pulse (e.g., one symbol long). Note that when using long pulses, the first samples received are ignored until pulse transmission is complete. The first samples are caused by reflections from the hybrid and are not to be considered a cable fault. Note also that when short pulses are used, the value of the parameter initial_skip is decreased since the pulse width is now shorter and fewer initial samples need be ignored. It is further noted that short pulses may be used for identification of cable topology.

Third, a second mode of operation, described supra, enables the TDR based detection mechanism to operate on echo canceller coefficients rather than the reflected signal samples. This permits the detection of cable faults and cable length during normal operation of the link, i.e. when the link partner is active.

Once the location and corresponding amplitude value for each peak are determined, the length and the impedance can be calculated as a function of the peak location and value as follows.

Length and impedance calculation:

$$L = (\text{peak\_location} - \text{delay}) \cdot \text{speed} \quad (4)$$

$$G = \frac{-\text{peak\_amp}}{\text{peak\_amp\_ref}(\text{round}(L))}$$

$$Z\_\text{load} = 100 \cdot \frac{1+G}{1-G}$$

Figure 6:
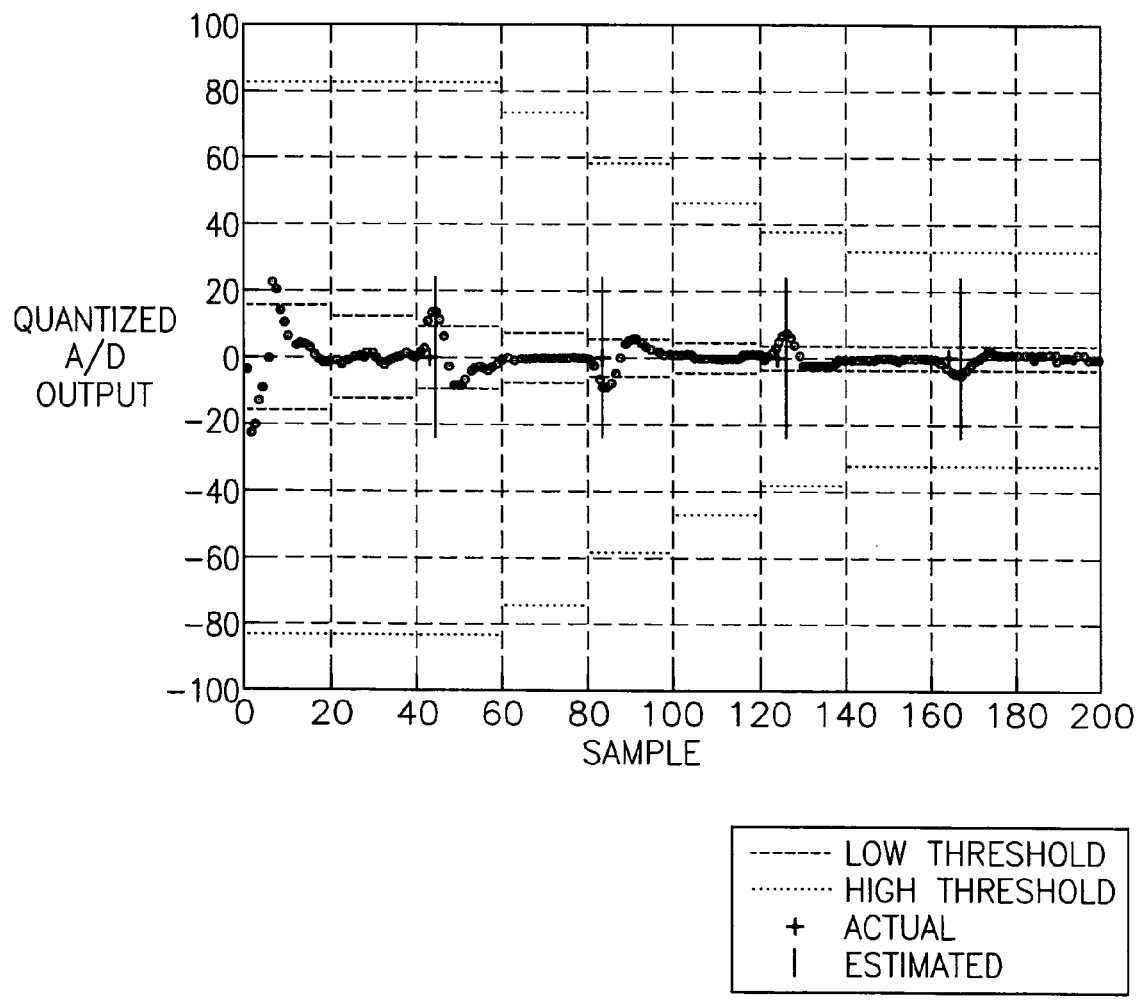
FIG. 6 is a diagram illustrating the amplitude of samples representing the reflected signal for a five-symbol transmitted pulse.
Figure 7:
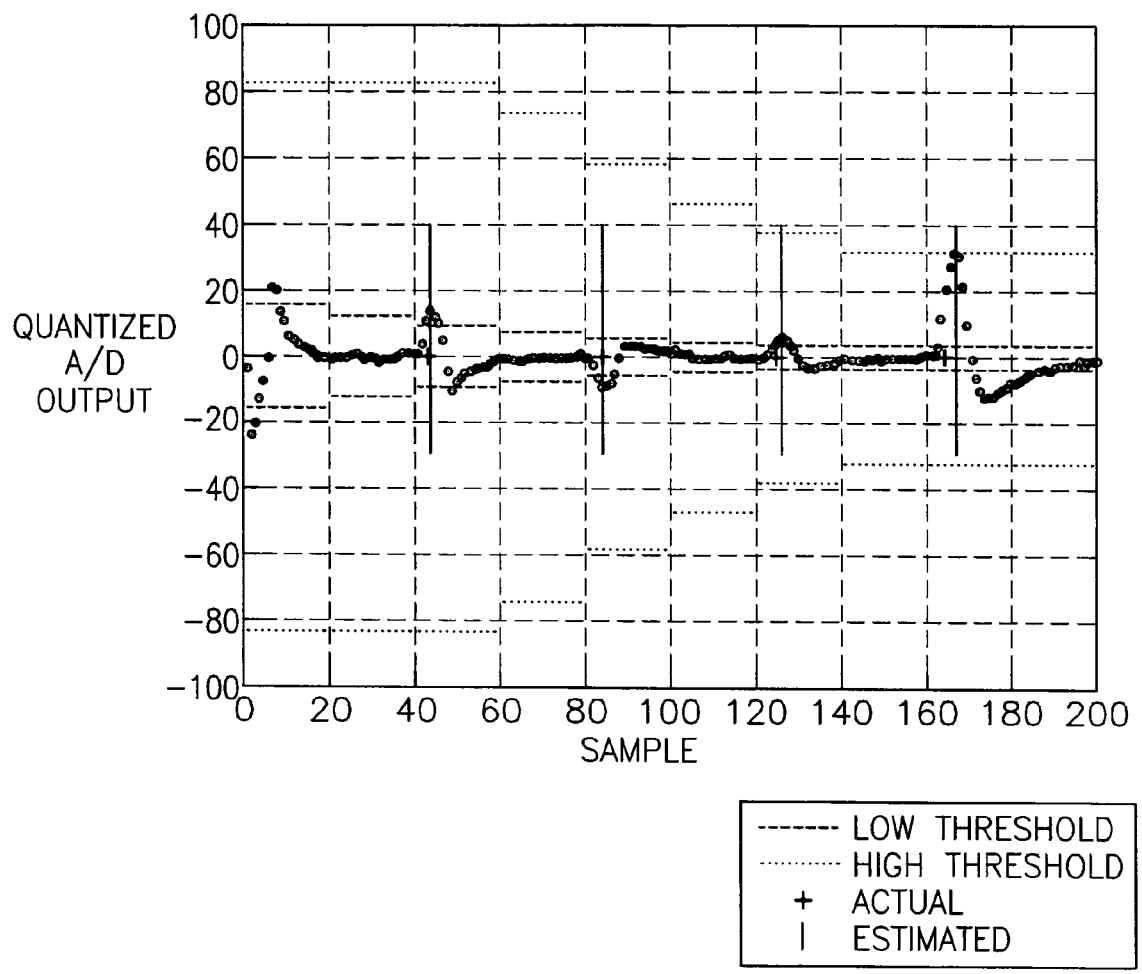
FIG. 7 is a diagram illustrating the amplitude of samples representing the reflected signal for a five-symbol transmitted pulse on an open cable.

Display length and impedance:
1. If G=1 display "open"
2. If G=−1 display "short"

where
 peak_location: denotes the peak location in samples;
 delay: a fixed delay introduced by the transmitter and receiver mechanism;
 speed: the propagation speed of the signal over the specific type of cable (note that there is a different typical value for each cable type (Cat 3, 4, 5, 6, 7, etc.);
 peak_amp: the peak value;
 peak_amp_ref: a pre-calculated table for the specific cable type under test, which specifies the theoretical expected peak amplitude of an open/short cable, where each row of the table represents a different cable length;
 L: the estimated length in meters;
 Z_load: the estimated impedance in Ohms;

A diagram illustrating the amplitude of samples representing the reflected signal for a five-symbol transmitted pulse is shown in FIG. 6. A diagram illustrating the amplitude of samples representing the reflected signal for a five-symbol transmitted pulse on an open cable is shown in FIG. 7. Both FIGS. 6 and 7 illustrate the TDR mechanism response for a cable with four segments, each segment having a length of 30 meters, yielding a total cable length of 120 meters. In FIG. 6, all reflection coefficients are 20 dB, while in FIG. 7 the last reflection represents an open cable and is therefore much stronger. The immediate zero distance response represents effects caused by the blind-spot effect and the transmitter hybrid. These effects are characterized by wide pulses and are therefore ignored.

Figure 8:
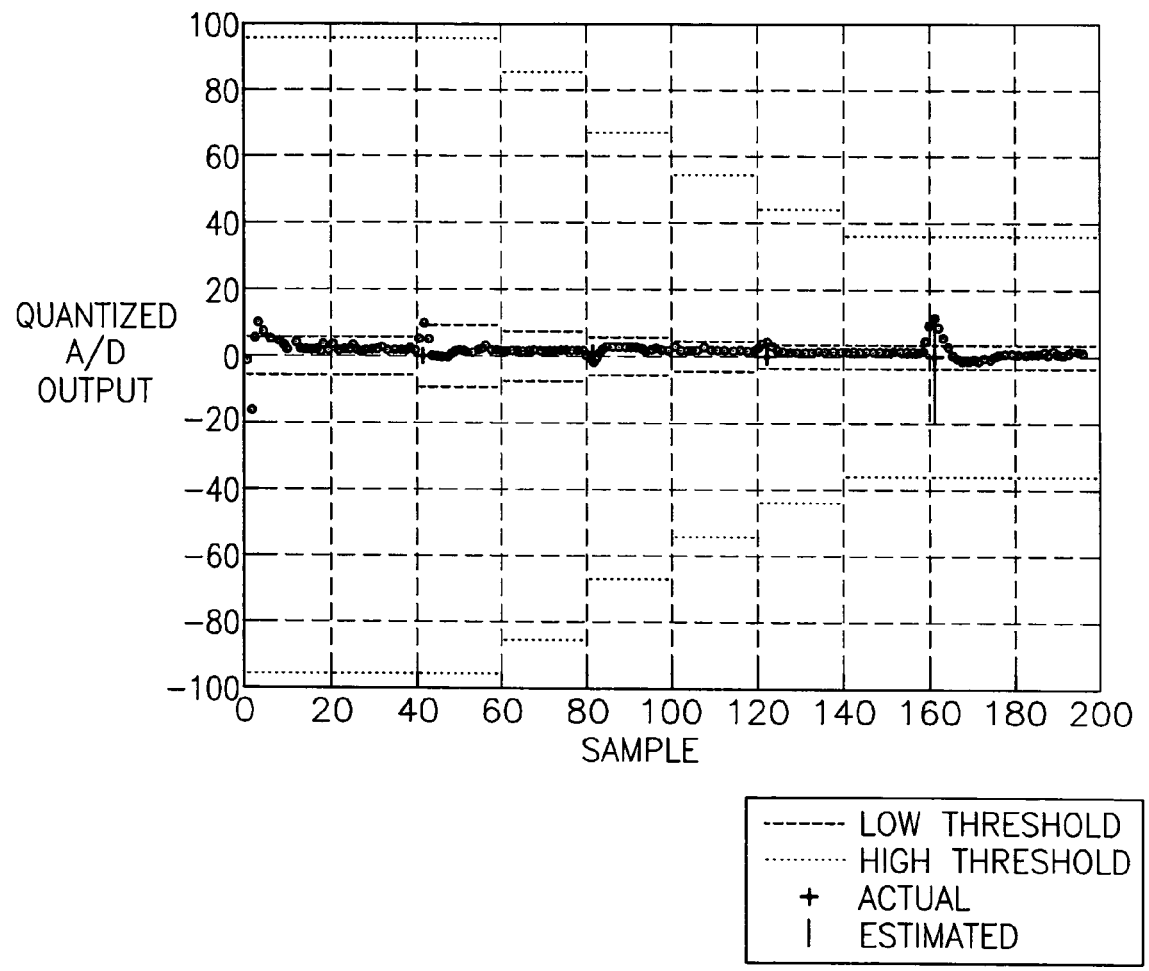
FIG. 8 is a diagram illustrating the amplitude of samples representing the reflected signal for a one-symbol transmitted pulse.

In accordance with the TDR mechanism of the present invention, more accurate estimation of the short cable segment is achieved using a second pass of the algorithm with a shorter pulse, as shown in FIG. 8. In this case, the diagram illustrates the amplitude of samples representing the reflected signal for a one-symbol transmitted pulse.

In all three FIGS. 6, 7 and 8, the dashed line represents the low threshold, while the dotted line represents the high threshold. In addition, the solid dots and the vertical solid lines represent the actual and estimated connector locations and cable length, respectively. The pulses transmitted comprise standard Gigabit Ethernet 1 V pulses. The vertical scale represents the quantized output of the A/D converter assuming a maximum A/D input level of 0.5 V and 256 levels. Each peal in the return samples represents an impedance mismatch or other fault. Note that the return peaks further from the transmitter represent the same type of mismatch but are a weaker return signal due to attenuation. A good quality connector properly installed generates a flat return. A good connector matches its load to the load of the cable and thus generates minimal reflections. As shown in the Figures the longer the cable the weaker the reflection coming back for the same mismatch value. The impedance value is the same (but a longer cable generates more attenuation resulting in a weaker signal), because returns from further out on the cable are weaker, the invention uses dynamic thresholds to identify faults. A high threshold is used when there is an open or short at the end because the reflection is very strong due to a strong mismatch.

Note that wider pulses are better suited for long cables while short pulses are optimal for identifying cable faults close to the transmitter. In the examples presented herein, rectangular pulses were used. It is appreciated that other types of pulses may be used as well depending on the expected channel impulse response, the dynamic range of impedance discontinuance it is desired to handle and the estimation resolution required. Both the low and high thresholds are read from a table and preferably should be adjusted for the transmitted pulse.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of performing diagnostics on a channel including a cable using circuitry embedded in a communications transceiver without the need to use special cable measurement equipment, said method comprising the steps of:
 generating, in said communications transceiver, a programmed pulse based on a dynamic channel impulse response of said channel, wherein said pulse may be positive or negative;

transmitting said pulse from one end of said cable;
receiving a reflected signal and generating a plurality of sequences of samples therefrom;
ignoring an initial sequences of samples;
detecting and measuring the amplitude of positive and negative peaks present in said reflected signal;
determining diagnostic information about said cable based on the location and amplitude of said positive and negative peaks; and
identifying a topology for said cable.

2. The method according to claim 1, wherein the width of said pulse is programmable.

3. The method according to claim 1, wherein the width of said pulse is one symbol wide for better diagnostic accuracy with shorter lengths of cable.

4. The method according to claim 1, wherein the width of said pulse is five symbols wide for better diagnostic accuracy with longer lengths of cable.

5. The method according to claim 1, wherein a peak is identified only if both its positive and negative portions are detected.

6. The method according to claim 1, wherein said positive peak is declared for a sample if the absolute value of the sample exceeds a low threshold, the sample is positive, the sample is larger than a previous number of samples and the sample is larger than a number of subsequent samples.

7. The method according to claim 1, wherein said negative peak is declared for a sample if the absolute value of the sample exceeds a low threshold, the sample is negative, the sample is smaller than a previous number of samples and the sample is smaller than a number of subsequent samples.

8. The method according to claim 1, wherein said step of detecting of peaks comprises the step of declaring an unmatched peak if in a sufficient number of samples following a first peak, a second peak having a sign opposite that of said first peak and smaller absolute value is found and ignored.

9. The method according to claim 1, wherein said step of detecting of peaks comprises the step of declaring a matched peak if following a first peak, a second peak having a sign opposite that of said first peak and smaller absolute value is found and ignored.

10. The method according to claim 1, further comprising the step of declaring an open or shorted cable if a peak is identified that exceeds a high threshold.

11. The method according to claim 1, further comprising the step of ignoring peaks having a sign opposite that of a previously identified peak.

12. The method according to claim 1, wherein said step of determining comprises generating cable length as a function of peak location and amplitude information.

13. The method according to claim 1, wherein said step of determining comprises the step of locating one or more impedance mismatches existing along said cable.

14. The method according to claim 1, further comprising the step of performing generating, receiving and detecting several times and averaging corresponding samples.

15. The method according to claim 1, wherein the step of generating comprises the step of generating a plurality of pulses, each having different lengths.

16. An apparatus embedded in a communications transceiver, said apparatus for performing cable diagnostics on a channel including a, comprising:
a pulse generator coupled to said channel, said pulse generator operative to program a pulse based on a dynamic channel impulse response of said channel which is transmitted onto said cable;
a peak detector coupled to said cable and operative to detect and measure the amplitude of positive and negative peaks present in a reflected signal;
a memory coupled to said peak detector for storing peak location and amplitude information; and
means for determining diagnostic information about said cable based on the location and amplitude of said positive and negative peaks.

17. An apparatus embedded in a communications transceiver, said apparatus for performing cable diagnostics on a channel including a cable, said apparatus comprising:
means for generating in said communications transceiver a programmed pulse based on a dynamic channel impulse response of said channel, wherein said pulse is transmitted from one end of said cable;
means for receiving a reflected signal and generating a sequence of samples therefrom;
means for detecting and measuring the amplitude of positive and negative peaks present in said reflected signal; and
means for determining diagnostic information about said cable based on the location and amplitude of said positive and negative peaks.

18. A communications transceiver having an embedded time domain reflectometry (TDR) diagnostic module and coupled to a channel including a cable, said transceiver comprising:
a pulse generator coupled to said channel, said pulse generator operative to program a pulse based on a dynamic channel impulse response of said channel;
a transmitter to transmit said pulse onto said cable;
a receiver for receiving a reflected signal;
a peak detector coupled to said cable and operative to detect and measure the amplitude of positive and negative peaks present in said reflected signal;
a memory coupled to said peak detector for storing peak location and amplitude information; and
means foe determining diagnostic information about said cable based on the location and amplitude of said positive and negative peaks.

* * * * *